United States Patent
Tsui et al.

(10) Patent No.: US 7,342,315 B2
(45) Date of Patent: Mar. 11, 2008

(54) METHOD TO INCREASE MECHANICAL FRACTURE ROBUSTNESS OF POROUS LOW K DIELECTRIC MATERIALS

(75) Inventors: Ting Yiu Tsui, Garland, TX (US); Andrew John McKerrow, Dallas, TX (US); Jeannette M. Jacques, Tallahassee, FL (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/114,563

(22) Filed: Apr. 25, 2005

(65) Prior Publication Data

US 2005/0196955 A1    Sep. 8, 2005

Related U.S. Application Data

(63) Continuation-in-part of application No. 10/739,590, filed on Dec. 18, 2003, now abandoned.

(51) Int. Cl.
*H01L 23/48* (2006.01)
*H01L 47/63* (2006.01)

(52) U.S. Cl. ............... 257/758; 438/624; 257/E21.576
(58) Field of Classification Search ............... 257/506, 257/524; 438/795
See application file for complete search history.

(56) References Cited

U.S. PATENT DOCUMENTS

| | | | |
|---|---|---|---|
| 6,107,225 A * | 8/2000 | Shobu et al. | 501/92 |
| 6,303,192 B1 * | 10/2001 | Annapragada et al. | 427/527 |
| 6,465,365 B1 * | 10/2002 | Annapragada | 438/763 |
| 6,593,653 B2 * | 7/2003 | Sundararajan et al. | 257/751 |
| 6,787,446 B2 * | 9/2004 | Enomoto et al. | 438/623 |
| 2003/0111263 A1 * | 6/2003 | Fornof et al. | 174/262 |
| 2005/0064699 A1 * | 3/2005 | Kondo et al. | 438/624 |

* cited by examiner

*Primary Examiner*—Lex Malsawma
(74) *Attorney, Agent, or Firm*—W. James Brady, III; Frederick J. Telecky, Jr.

(57) ABSTRACT

The present invention provides an insulating layer 100 for an integrated circuit 110 comprising a porous silicon-based dielectric layer 120 located over a substrate 130. The insulating layer comprises a densified layer 140 comprising an uppermost portion 142 of the porous silicon-based dielectric layer.

16 Claims, 4 Drawing Sheets

METHOD TO INCREASE MECHANICAL FRACTURE ROBUSTNESS OF POROUS LOW K DIELECTRIC MATERIALS

CROSS-REFERENCE TO RELATED APPLICATIONS

This application is a continuation-in-part of U.S. patent application Ser. No. 10/739,590, entitled "ADHESION TREATMENT FOR OSG-DIELECTRIC FILM ADHESION," to Willecke, Tsui and McKerrow, filed on Dec. 18, 2003, now abandoned which is commonly assigned with the present invention and incorporated herein by reference as if reproduced herein in its entirety.

TECHNICAL FIELD OF THE INVENTION

The present invention is directed, in general, to a method for manufacturing an integrated circuit and more specifically to an insulating layer and its method of manufacture for the integrated circuit.

BACKGROUND OF THE INVENTION

The continuing miniaturization of microelectronic devices and the desire to produce faster devices has resulted in a shift toward the use of dielectric materials having a lower dielectric constant (k) than conventional silicon dioxides. In particular there are several advantages associated with using ultra-low k dielectric materials (e.g., a k less than 3) as an insulating layer. Ultra-low insulating layers allow smaller spacing between device features by reducing the extent of crosstalk and capacitive coupling between devices. Using ultra-low k dielectric materials as intra-layer or inter-metal insulating layers can also reduce the requisite drive current and power consumption for microelectronic devices. Moreover device speeds are increased because the RC delay associated with interconnect metal layers and intra-metal dielectric layers is decreased when using ultra-low k insulating layers.

There is growing interest in the use of insulating layers made of porous ultra-low k silicon-based dielectric materials. Insulating layers made of porous ultra-low k silicon-based material retain many of the advantages of conventional silicon oxides, thereby allowing ready integration into existing integrated circuit manufacturing processes. Unfortunately insulating layers made of porous ultra-low k silicon-based dielectric layers are also more susceptible to cracking and fracture than conventional silicon dielectric materials. Consequently integrated circuits containing insulating layers made of porous ultra-low k silicon-based dielectric material can have reduced reliability, or there are reduced manufacturing yields of operative integrated circuits.

Current methods to reduce cracks in porous ultra-low k silicon-based dielectric layers include electron beam or UV curing. Both of these methods are problematic however. Electron beam curing undesirably induces surface damage, increases k, increases thickness non-uniformity and increases moisture absorption. UV curing also undesirably increases k, thickness non-uniformity and moisture absorption, and additional requires long processing times (e.g., 5 to 10 minutes). Moreover, the cost the electron beam or UV curing tool and its maintenance significantly increase manufacturing costs.

Accordingly, what is needed in the art is an insulating layer with improved crack resistance and a method of manufacturing the same that can be easily and inexpensively integrated into existing integrated circuit fabrication processes.

SUMMARY OF THE INVENTION

To address the above-discussed deficiencies of the prior art, the present invention provides in one embodiment, an insulating layer for an integrated circuit. The insulating layer comprises a porous silicon-based dielectric layer located over a substrate and a densified layer comprising an uppermost portion of the porous silicon-based dielectric layer.

Another embodiment is a method of fabricating an insulating layer for an integrated circuit. The method comprises forming a porous silicon-based glass layer over a substrate. The method also comprises plasma treating the porous silicon-based glass layer to transform an uppermost portion of the porous silicon-based glass layer to a densified layer.

Still another embodiment comprises a method of manufacturing an integrated circuit. The method comprises forming a microelectronic device on a substrate and forming the insulating layer over the microelectronic device as described above.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

The present invention recognizes, for the first time, that the plasma treatment of a porous silicon-based dielectric layer substantially reduces the propensity for cracks to form in the layer. Crack resistance is characterized in terms of a crack propagation rate. One of ordinary skill in the art would be familiar with methods of measuring the crack propagation rate, also known as a crack velocity, on insulating layers. While not limiting the scope of the invention by theory, it is believed that the plasma treatment reduces the crack velocity by transforming a portion of porous silicon-based dielectric layer into a densified layer.

Figure 1:
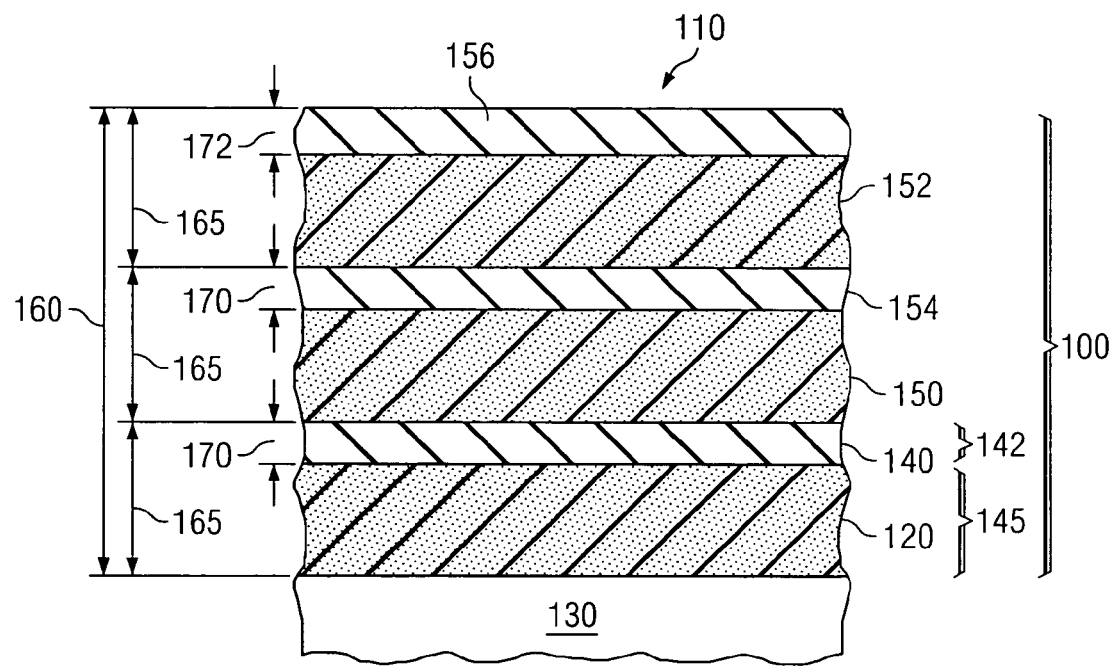
FIG. 1 shows a cross-sectional view of an exemplary insulating layer for an integrated circuit according to the principles of the present invention.

One embodiment of the present invention is an insulating layer for an integrated circuit. FIG. 1 shows a cross-sectional view of an exemplary insulating layer 100 for an integrated circuit 110 according to the principles of the present invention. As illustrated in FIG. 1 the insulating layer 100 comprises a porous silicon-based dielectric layer 120 located over a substrate 130. The insulating layer 100 also comprises a densified layer 140 comprising an uppermost portion 142 of the porous silicon-based dielectric layer 120. Again while not limiting the scope of the invention by theory, it is believed that the elastic modulus of the densified layer 140 is greater than the elastic modulus than the uppermost portion 142 of the porous silicon-based dielectric layer 120 before plasma treatment. It is further believed that the increased elastic modulus of the densified layer 140 confers crack resistance by reducing the insulating layer's 100 crack velocity.

The substrate 130 can comprise any conventional material used in microelectronic device fabrication. In certain preferred embodiments, the substrate 130 is a silicon wafer. The substrate 130 can include other conventional materials, such as oxide and metal layers, used in the manufacture of active or passive devices. Other conventional substrate materials, including silicon-on-insulator (SOI) and silicon-germanium substrates, are also within the scope of the invention.

The term porous silicon-based dielectric layer 120 as used herein refers to a layer having a density that is less than a density of a substantially similar silicon-based dielectric layer having an ideal fully crystalline structure. An ideal fully crystalline structure is substantially defect-free.

The term densified layer 140 refers to a layer within the porous silicon-based dielectric layer 120 having a density that is at least about 20 percent higher than the density of a remaining portion of porous 145 silicon-based dielectric layer 120 that was not transformed by the plasma treatment. For some preferred embodiments of the insulating layer 100, the density of the densified layer 140 is about 20 to about 25 percent higher than the density of the remaining portion of the porous silicon-based dielectric layer 145. One of ordinary skill in the art would be familiar with methods to measure density or relative densities. For example conventional electronic density measurements can be used to determine the relative densities of the porous silicon-based dielectric layer 120, densified layer 140 or the remaining non-transformed portion 145 of the porous silicon-based dielectric layer 120.

As an illustrative example, consider a porous silicon-based dielectric layer 120 comprising porous organo-silicate glass (OSG). The corresponding silicon-based dielectric layer having an ideal substantially defect-free fully crystalline structure is fused silica quartz. Fused silica quartz has a density of about 2.8 gm/cm$^3$. Thus, the porous silicon-based dielectric layer 120 of the present example is porous OSG having a density of less than about 2.8 gm/cm$^3$. If the density of the porous layer 120 is about 1.4 gm/cm$^3$ then the densified layer 140 of the present example would comprises OSG having a density that is about 1.6 gm/cm$^3$ or higher (e.g., about 20 percent or higher than the density of porous silicon-based dielectric layer 120).

One of ordinary skill in the art would be familiar with the densities of other silicon-based dielectric layers having an ideal substantially defect-free fully crystalline structure. Non-limiting examples of other porous silicon-based dielectric layer 120 materials include fluorosilicate glass (FSG), phosphosilicate glass (PSG), silicon carbide (SiC) and carbon-doped silicon oxides (SiCOH). In some cases it is advantageous for the porous silicon-based dielectric layer 120 to comprise an ultra-low k organo-silicate glass having a density of less than about 1.4 gm/cm$^3$ and more preferably less than 1.2 gm/cm$^3$. In other cases the porous silicon-based dielectric layer 120 comprises carbon silicide having a density of less than about 3.2 gm/cm$^3$. Still other advantageous embodiments of the porous silicon-based dielectric 120 layer comprise carbon silicide having a dielectric constant of about 3 or lower.

It is advantageous for the insulating layer 100 to comprise a stack of porous silicon-based dielectric layers. As an example, the embodiment depicted in FIG. 1 shows the insulating layer 100 comprising a stack of porous silicon-based dielectric layers 120, 150, 152. Preferably, the porous silicon-based dielectric layers 120, 150, 152 each have their own respective densified layer 140, 154, 156. Other preferred embodiments of the insulating layer 100 comprise a stack from two to six of porous silicon-based dielectric layers with each of these layers having their own densified layer.

An insulating layer 100 comprising a stack of porous layers is advantageous because it has a lower crack velocity than a single porous silicon-based dielectric layer. As an example, consider an embodiment where a single porous silicon-based dielectric layer 120 and single densified layer 140 forms an insulating layer 100 on the substrate 110. Embodiments of such an insulating layer 100 have a crack propagation rate that is at least about 100 times lower as compared to an insulating layer with a substantially similar porous silicon-based dielectric layer but with no densified layer formed over a substantially similar substrate. A stacked insulating layer 100 comprising two porous silicon-based dielectric layers 120, 150, each having a densified layer 140, 154, further reduces the crack propagation rate by about an order of magnitude. Stacked insulating layers 100 having additional porous silicon-based dielectric layers 152 and densified layers 156 can further reduce the crack velocity.

The enhanced reduction in the crack velocity associated with the stacked layer 120, 150, 152 is thought to be due to the greater number of densified layers 140, 154, 156 present therein. In addition, decreasing the thickness of the porous silicon-based dielectric layers in the stacked layer 120, 150, 152 is also thought to reduce the crack propagation rate of the insulating layer 100.

Additionally, the number of porous silicon-based dielectric layers and their thicknesses are carefully selected to provide the desired total thickness 160 of the insulating layer 100. For example consider embodiments where the total thickness 160 of the insulating layer 100 ranges from 1 to 5 microns. In advantageous embodiments of the insulating layer 100 the porous silicon-based dielectric layers 120, 150, 152 have a thickness 165 ranging from about 15 to about 50 percent of the total thickness 160 of the insulating layer 100. Of course, other embodiments of the insulating layer 100 can have porous silicon-based dielectric layers 120, 150, 152 with different thickness than each other.

To reduce the crack velocity while at the same time providing an ultra-low k insulating layer 100 it is critical to adjust the thickness 170 of the densified layer 140 to a selected range that balances these considerations. Preferably, the thickness 170 is adjusted to a range that is not too small as to not confer crack resistance, but not too large as to increase the dielectric constant of the insulating layer 100.

In the some cases, the thickness 170 of the densified layer 140 ranges from about 10 to about 50 nanometers. In still other cases, the densified layer 140 has a thickness 170 ranging from about 1 to 5 percent of a thickness 165 of the porous silicon-based dielectric layer 120. Of course the individual densified layers 140, 154, 156 can have the same or different thicknesses as each other. For instance, in some cases to increase the crack resistance of the insulating layer 100, it is desirable for the outer or cap densified layer 156 to have a greater thickness 172 (e.g., about 10 percent or more) than the thickness 170 of the lower or interior densified layers 140, 154.

Figure 2:
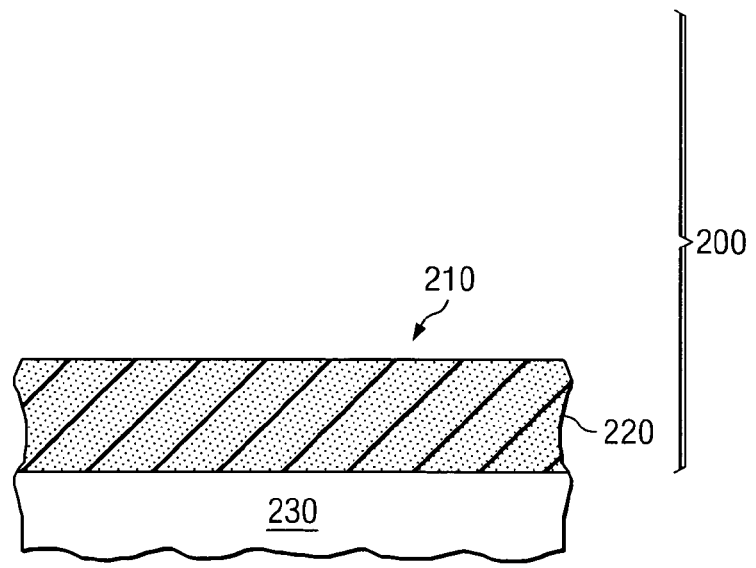
FIGS. 2 to 4 illustrate cross-section views of selected steps in an exemplary method of fabricating an insulating layer for an integrated circuit layer according to the principles of the present invention.
Figure 3:
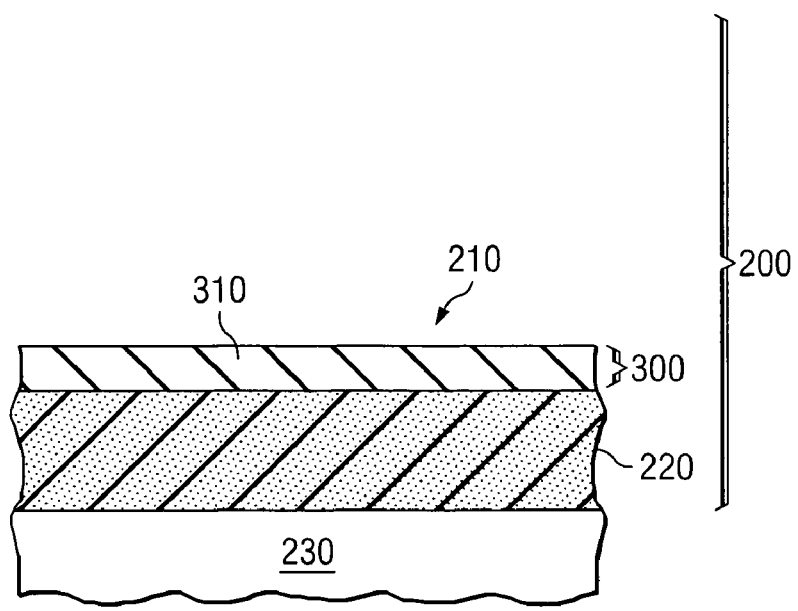
Figure 4:
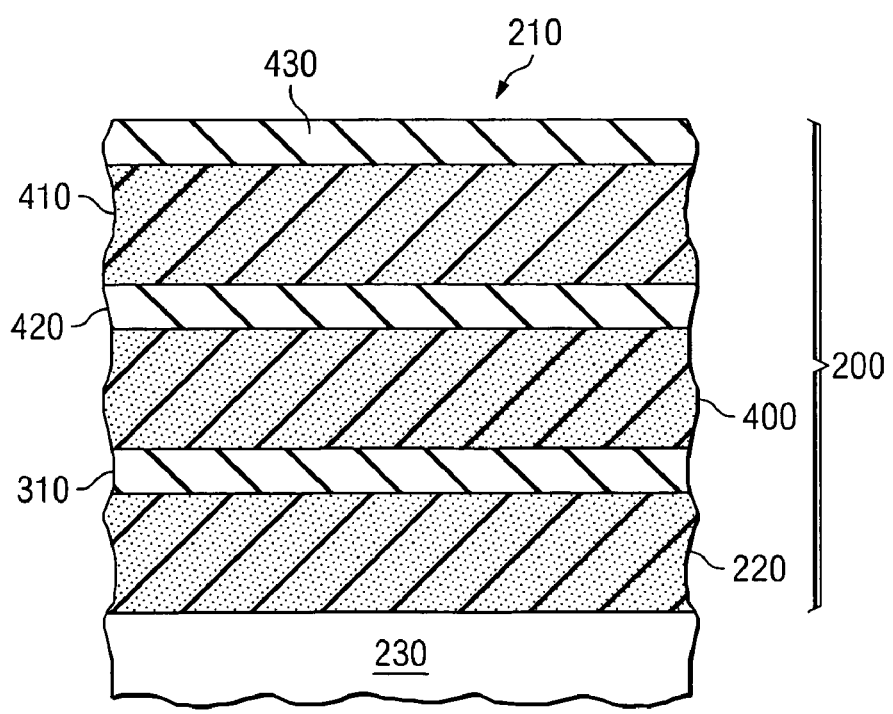

Another aspect of the present invention is a method of fabricating an insulating layer. The method can be used to fabricate any of the above-described embodiments of the insulating layer discussed in the context of FIG. 1. FIGS. 2-4 illustrate cross-section views of selected steps in an exemplary method of fabricating an insulating layer 200 for an integrated circuit 210 according to the principles of the present invention.

Turning first to FIG. 2, presented is the partially completed insulating layer 200 after forming a porous silicon-based dielectric layer 220 over a substrate 230. In some preferred embodiments the porous silicon-based dielectric layer 220 is formed using chemical vapor deposition (CVD), and more preferably plasma enhanced chemical vapor deposition (PECVD).

For example in some advantageous embodiments the porous silicon-based dielectric layer 220 comprises a porous OSG layer. In some cases the porous OSG layer is formed by chemical vapor depositing a conventional organosilane gas such as octamethylcyclotetrasiloxane, in the presence of $C_2H_4$, $O_2$, $H_2$ gases or mixtures thereof. Preferred plasma conditions during CVD include a radiofrequency plasma comprising a frequency of about 14 kHz and power ranging from about 600 W to about 1000 W and chamber temperature and pressure ranging from about 350 to 450° C. and about 5 to 7 Torr, respectively. One of ordinary skill in the art would be aware of conventional processes to form porous silicon-based dielectric layers 220 comprising other types of material.

With continuing reference to FIG. 2, FIG. 3 presents the partially completed insulating layer 200 after plasma treating the porous silicon-based dielectric layer 220 to transform an uppermost portion 300 of the porous silicon-based dielectric layer 220 to a densified layer 310.

In some preferred embodiments plasma treating comprises forming a radiofrequency plasma in the presence of a gas. The gas can comprise any conventional material used in semiconductor industry, including reactive gases such as hydrogen or oxygen. In some cases, however, an oxygen plasma treatment can detrimentally deplete the carbon content of the porous silicon-based dielectric layer 220. Depleting the carbon content of the porous silicon-based dielectric layer 220 can detrimentally increase the dielectric constant of the layer 220. This is particularly a concern when the layer 220 comprises a carbon-doped silicon oxide layer. In still other instances, a hydrogen plasma treatment can undesirably modify the porous silicon-based dielectric layer 220 by forming silane (SiHx) groups in the densified layer 310 which can increase the propensity for the porous layer 220 to absorb moisture.

In certain preferred embodiments of the method the gas comprises a noble gas. A noble gas is defined as any element in Group 18 of the Periodic Table of Elements. Noble gases such as helium and argon and mixtures thereof advantageously strike a balance between breaking of the carbon silicon bonds of the porous silicon-based glass layer 220 but otherwise not chemically reacting with or modifying the upper most portion 300 the porous layer 220. In other cases helium is preferred over argon. For instance helium is preferred where a pure source of argon cannot be obtained or when the tool used for plasma treatment does not have plumbing to accommodate argon.

In some preferred embodiments, plasma treating comprises introducing the gas into a plasma chamber at a chamber pressure of about 2 to about 9 Torr and chamber temperature of about 350° C. to about 400° C. The gas flow preferably ranges from about 500 to about 2800 sccm. The plasma is generated by applying a radiofrequency of about 14 kHz to a coil at a power ranging from about 150 to about 400 Watts. In some preferred embodiments the plasma treatment is applied for about 5 to about 20 seconds.

With continuing reference to FIGS. 2-3, FIG. 4 presents the partially completed insulating layer 200 after repeating the above-described steps, of forming the porous silicon-based dielectric layer 220 and then plasma treating, a plurality of times to form a stack of porous silicon-based dielectric layers 220, 400, 410. Each of the porous silicon-based dielectric layers 220, 400, 410 of the stack have their own respective densified layer 310, 420, 430.

Figure 5:
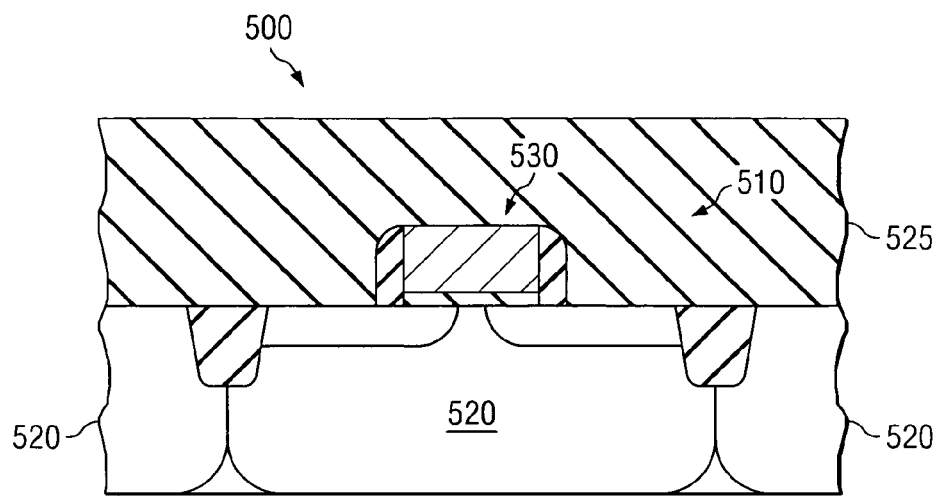
FIGS. 5 to 7 present cross-sectional views of an exemplary method of manufacturing an integrated circuit according to the principles of the present invention.
Figure 6:
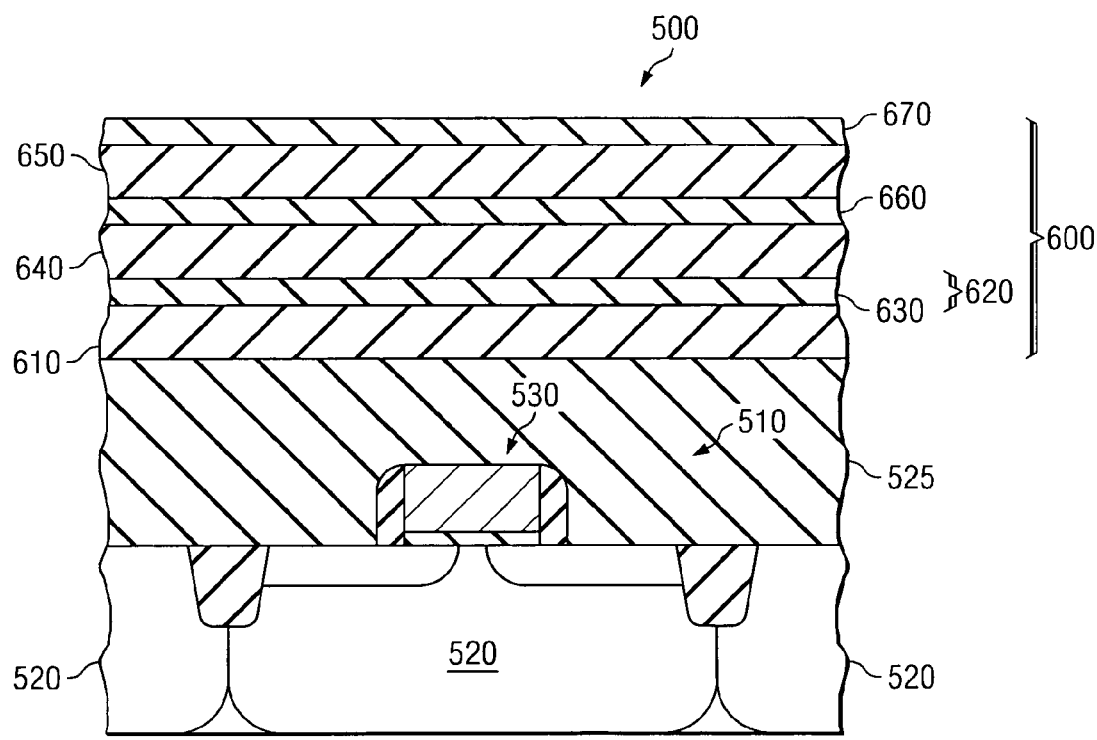
Figure 7:
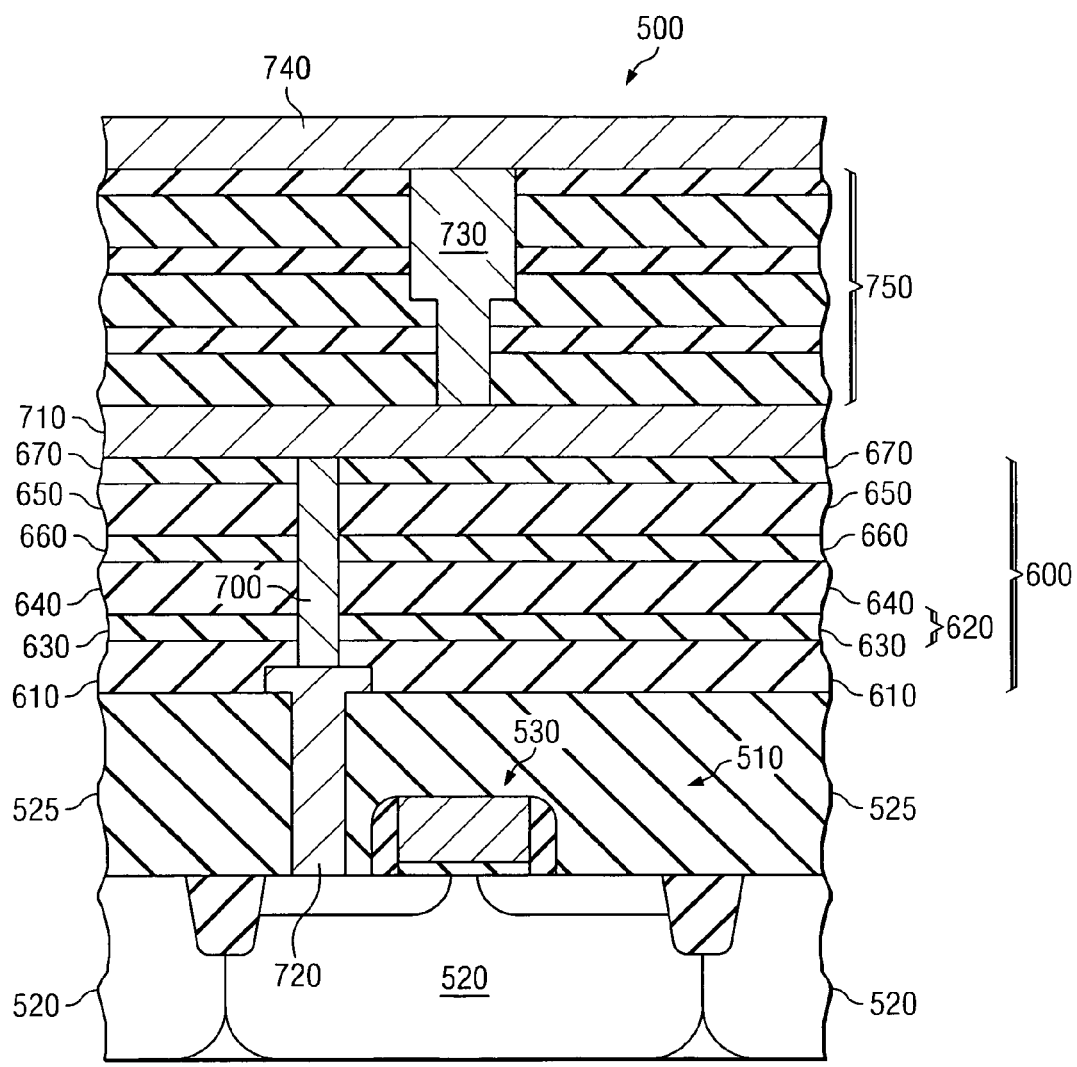

Another aspect of the present invention is a method of manufacturing an integrated circuit. FIGS. 5-7 illustrate cross-sectional views of selected steps in an exemplary method of manufacturing an integrated circuit 500 according to the principles of the present invention. Turning first to FIG. 5, illustrated is the partially completed integrated circuit 500 after forming a microelectronic device 510 on a substrate 520. In some cases, such as illustrated in FIG. 5, the integrated circuit 500 includes a conventional dielectric layer 525, such as silicon dioxide, formed over the microelectronic device 510. In other cases, however, the dielectric layer 525 comprises a porous silicon-based dielectric layer. In some embodiments the microelectronic device 510 comprises an MOS transistor 530. Embodiments of the microelectronic device 510 can further comprise nMOS or pMOS transistors, CMOS, BiCMOS devices, bipolar or other types of active or passive integrated circuit components, and combinations thereof.

FIG. 6 illustrates the partially completed integrated circuit 500 after forming an insulating layer 600 over the microelectronic device 510. Forming the insulating layer 600 comprises forming a porous silicon-based dielectric layer 610 over the substrate 520. Forming the insulating layer 600 also comprises plasma treating the porous silicon-based dielectric layer 610 to transform an uppermost portion 620 of the porous silicon-based dielectric layers 610 to a densified layer 630.

The steps to form the insulating layer 600 can comprise any of the above-described embodiments discussed in the context of FIGS. 1-4. For instance, the steps to form the porous silicon-based dielectric layer and the plasma treatment can be repeated a plurality of times to form a stack of porous silicon-based dielectric layers 610, 640, 650. Each of the porous silicon-based dielectric layers 610, 640, 650 have a densified layer 630, 660, 670.

FIG. 7 depicts the partially completed integrated circuit 500 after forming an interconnect 700 and a metal layer 710 in or on the insulating layer 600. For the particular embodiment shown in FIG. 7 the interconnect 700 contacts another interconnect 720 that extends thorough the dielectric layer 525 and contacts the microelectronic device 510. Those skilled in the art would be familiar with the variety of conventional photolithography and etching processes that can be used to form the interconnect 700 and the metal layer 710. Those skilled in the art would also be familiar with the conventional techniques such as physical vapor deposition and electrochemical deposition to fill the interconnect and metal layer 710 with conventional materials. In some preferred embodiments for instance the interconnect 700 and metal layer 710 comprise copper.

As further illustrated in FIG. 7 the above described steps can be extended to form additional interconnects 730, metal layers 740 and insulating layers 750 over the microelectronic device 510. Those skilled in the art would understand how to connect the interconnects 700, 720 740 and metal layer 710 with the microelectronic device 510 and other microelectronic devices to form an operative integrated circuit 500.

Although the present invention has been described in detail, those skilled in the art should understand that they can make various changes, substitutions and alterations herein without departing from the scope of the invention in its broadest form.

What is claimed is:

1. An insulating layer for an integrated circuit comprising: a stack of porous silicon-based dielectric layers located over a substrate wherein each of said porous silicon-based dielectric layers have a densified layer comprising an uppermost portion of each of said porous silicon-based dielectric layers, the densified layers having a thickness ranging from about 10 to about 50 nanometers and a density that is at least 20% greater than a density of a portion of the porous silicon based dielectric layers that is not densified, and further wherein said stack is defined by one or more lower layers adjacent said substrate and an outer layer opposite the one or more lower layers and wherein a thickness of said densified layer of said outer layer is greater than a thickness of each of the one or more lower densified layers of said stack.

2. The insulating layer as recited in claim 1, wherein said stack comprises from two to six of said porous silicon-based dielectric layers.

3. The insulating layer as recited in claim 2, wherein each of said porous silicon-based dielectric layers has a thickness ranging from about 15 to about 50 percent of a total thickness of said insulating layer.

4. The insulating layer as recited in claim 1, wherein said densified layers have a thickness ranging from about 1 to 5 percent of a thickness of said porous silicon-based dielectric layers.

5. The insulating layer as recited in claim 1, wherein said porous silicon-based dielectric layers comprise an ultra-low k organo-silicate glass having a density of less than about 2.8 $gm/cm^3$.

6. The insulating layer as recited in claim 1, wherein said porous silicon-based dielectric layers comprise an ultra-low k organo-silicate glass having a density of less than about 1.4 $gm/cm^3$.

7. The insulating layer as recited in claim 1, wherein said porous silicon-based dielectric layers comprise a carbon silicide having a density of less than about 3.2 $gm/cm^3$.

8. The insulating layer as recited in claim 1, wherein said porous silicon-based dielectric layers comprise a carbon silicide having a dielectric constant of about 3 or lower.

9. The insulating layer as recited in claim 1, wherein said porous silicon-based dielectric layers and said densified layers form an insulating layer that has a crack propagation rate that is at least 100 times lower as compared to a substantially similar porous silicon-based dielectric layer having no densified layer.

10. A method of fabricating an insulating layer for an integrated circuit, comprising:
    forming a porous silicon-based dielectric layer over a substrate; and
    plasma treating said porous silicon-based dielectric layer to transform an uppermost portion of said porous silicon-based dielectric layer to a densified layer having a density that is at least 20% greater than a density of a portion of the porous silicon based dielectric layer that is not densified, and further wherein the densified layer has a thickness ranging from about 10 to about 50 nanometers, wherein
    said forming and said plasma treating are repeated to form a stack of said porous silicon-based dielectric layers, each of said porous silicon-based dielectric layers having said densified layer, and
    said stack is defined by one or more lower layers adjacent said substrate and an outer layer opposite the one or more lower layers and wherein a thickness of said densified layer of said outer layer is greater than a thickness of each of the one or more lower densified layers of said stack.

11. The method as recited in claim 10, wherein said plasma treating comprises forming a radiofrequency plasma in the presence of a gas.

12. The method as recited in claim 10, wherein said gas comprises a noble gas selected from the group consisting of helium, argon and mixtures thereof.

13. The method as recited in claim 10, wherein said plasma treating comprises a frequency of about 14 KHz applied to a radiofrequency coil at a power ranging from about 150 W to about 400 W.

14. The method as recited in claim 10, wherein said plasma treating is applied for about 5 to about 20 seconds.

15. A method of manufacturing an integrated circuit having a crack resistant insulating layer comprising:
    forming a microelectronic device on a substrate; and
    forming an insulating layer over said microelectronic device comprising:
        forming a porous silicon-based dielectric layer over a substrate; and
        plasma treating said porous silicon-based dielectric layer to transform an uppermost portion of said porous silicon-based dielectric layer to a densified layer having a density that is at least 20% greater than a density of a portion of the porous silicon based dielectric layer that is not densified, and further wherein the densified layer has a thickness ranging from about 10 to about 50 nanometers, wherein
    said forming and said plasma treating are repeated to form a stack of said porous silicon-based dielectric layers, each of said porous silicon-based glass layers having said densified layer, and
    said stack is defined by one or more lower layers adjacent said substrate and an outer layer opposite the one or more lower layer and wherein a thickness of said densified layer of said outer layer is greater than a thickness of each of the one or more lower densified layers of said stack.

16. The method as recited in claim 15, wherein said stack comprises from 2 and 6 of said porous silicon-based dielectric layers and each of said densified layers have a thickness ranging from 10 to 15 nanometers.

* * * * *